United States Patent
Yoo

(10) Patent No.: US 12,119,882 B2
(45) Date of Patent: Oct. 15, 2024

(54) HIGH-SPEED OPTICAL ANALOG-TO-DIGITAL CONVERTER BASED ON COMPRESSIVE SENSING

(71) Applicant: The Regents of the University of California, Oakland, CA (US)

(72) Inventor: Sung-Joo Ben Yoo, Davis, CA (US)

(73) Assignee: The Regents of the University of California, Oakland, CA (US)

(*) Notice: Subject to any disclaimer, the term of this patent is extended or adjusted under 35 U.S.C. 154(b) by 103 days.

(21) Appl. No.: 17/925,786

(22) PCT Filed: Jun. 15, 2021

(86) PCT No.: PCT/US2021/037481
§ 371 (c)(1),
(2) Date: Nov. 16, 2022

(87) PCT Pub. No.: WO2021/257603
PCT Pub. Date: Dec. 23, 2021

(65) Prior Publication Data
US 2023/0283383 A1  Sep. 7, 2023

Related U.S. Application Data

(60) Provisional application No. 63/148,328, filed on Feb. 11, 2021, provisional application No. 63/039,901, filed on Jun. 16, 2020.

(51) Int. Cl.
*H04B 10/60* (2013.01)
*H04B 10/67* (2013.01)
(Continued)

(52) U.S. Cl.
CPC ............. *H04B 10/677* (2013.01); *G02F 7/00* (2013.01); *H03M 7/3062* (2013.01); *H04B 10/60* (2013.01);
(Continued)

(58) Field of Classification Search
CPC .... H04B 10/677; H04B 10/615; H04B 10/63; H04B 10/60; H04B 10/61; H04B 10/616; G02F 7/00; H03M 7/3062
(Continued)

(56) References Cited

U.S. PATENT DOCUMENTS 9,287,993 B1 * 3/2016 Adleman ............ H04B 10/2575
9,450,597 B1 * 9/2016 Ahmed .................. H03M 1/128
(Continued)

OTHER PUBLICATIONS

Fontaine et al., Coherent reception of 80 GBd QPSK using integrated spectral slice optical arbitrary waveform, Oct. 2012, CLEO, CTh1H.1.pdf, All Document. (Year: 2012).*
(Continued)

*Primary Examiner* — Dibson J Sanchez
(74) *Attorney, Agent, or Firm* — Park, Vaughan, Fleming & Dowler LLP

(57) ABSTRACT

During operation, the system receives an optical input signal, and also receives a reference optical frequency comb (OFC) signal. Next, the system uses a gapless spectral demultiplexer to spectrally slice the optical input signal to produce a set of spectral slices. The system also uses a high-contrast demultiplexer to strongly isolate each combline of the reference OFC signal to produce a set of reference comblines. Next, in a parallel manner, the system demodulates each spectral slice in the set of spectral slices centered on a single reference combline in the set of reference comblines to produce a set of baseband I/Q signals, wherein each spectral slice is demodulated based on a known code sequence. The system then digitizes the set of baseband I/Q signals to produce a set of digitized signals. Finally, the system processes the set of digitized signals to directly reconstruct a waveform for the optical input signal.

27 Claims, 14 Drawing Sheets

(51) Int. Cl.
  *G02F 7/00* (2006.01)
  *H03M 7/30* (2006.01)
  *H04B 10/61* (2013.01)
  *H04B 10/63* (2013.01)

(52) U.S. Cl.
  CPC ............ *H04B 10/61* (2013.01); *H04B 10/615* (2013.01); *H04B 10/616* (2013.01); *H04B 10/63* (2013.01)

(58) Field of Classification Search
  USPC .................................................. 398/202–214
  See application file for complete search history.

(56) References Cited

U.S. PATENT DOCUMENTS

| | | | | |
|---|---|---|---|---|
| 11,051,089 | B1* | 6/2021 | Nikolov | H04B 10/2575 |
| 11,750,357 | B1* | 9/2023 | Zhang | H04B 10/61 |
| | | | | 398/155 |
| 2007/0166048 | A1* | 7/2007 | Doerr | H04B 10/60 |
| | | | | 398/158 |
| 2010/0310256 | A1* | 12/2010 | Shpantzer | H04J 14/0298 |
| | | | | 398/74 |
| 2011/0234435 | A1* | 9/2011 | Woodward | G02F 7/00 |
| | | | | 341/137 |
| 2012/0075134 | A1* | 3/2012 | Rogers | H03M 1/128 |
| | | | | 341/155 |
| 2013/0315597 | A1* | 11/2013 | Shaver | H04B 10/69 |
| | | | | 398/79 |
| 2016/0149742 | A1* | 5/2016 | Yi | H04L 27/2697 |
| | | | | 398/76 |
| 2017/0033870 | A1* | 2/2017 | Dangui | H04J 14/02 |
| 2017/0188039 | A1* | 6/2017 | Siddiqui | H04N 19/51 |
| 2017/0222721 | A1* | 8/2017 | Dailey | H04B 10/25752 |
| 2018/0006730 | A1* | 1/2018 | Kuo | H04J 14/02 |
| 2018/0083599 | A1* | 3/2018 | Kippenberg | H04B 10/614 |
| 2019/0028203 | A1* | 1/2019 | Kuse | H04J 14/02 |
| 2019/0116074 | A1* | 4/2019 | Kim | H04L 27/148 |

OTHER PUBLICATIONS

Scott, Ryan, "Continuous, Real-Time, Full-Field Waveform Measurements via Spectral Slicing and Parallel Digital Coherent Detection", ResearchGate, Jan. 2010.

Ahmad, Bashar I., "A Survey of Wideband Spectrum Sensing Algorithms for Cognitive Radio Networks and Sub-Nyquist Approaches", arXiv:2001.02574v1, Jan. 2, 2020.

Hu, Zhuhua, "Adaptive and Blind Wideband Spectrum Sensing Scheme Using Singular Value Decomposition", Hindawi, vol. 2017, Article ID 3279452, Dec. 25, 2017.

Geisler, David J., "Terabit/Second Modulation Format Independent Optical Transmitter and Receiver Using Optical Arbitrary Waveform Generation and Measurement", ResearchGate, Jun. 4, 2014.

* cited by examiner

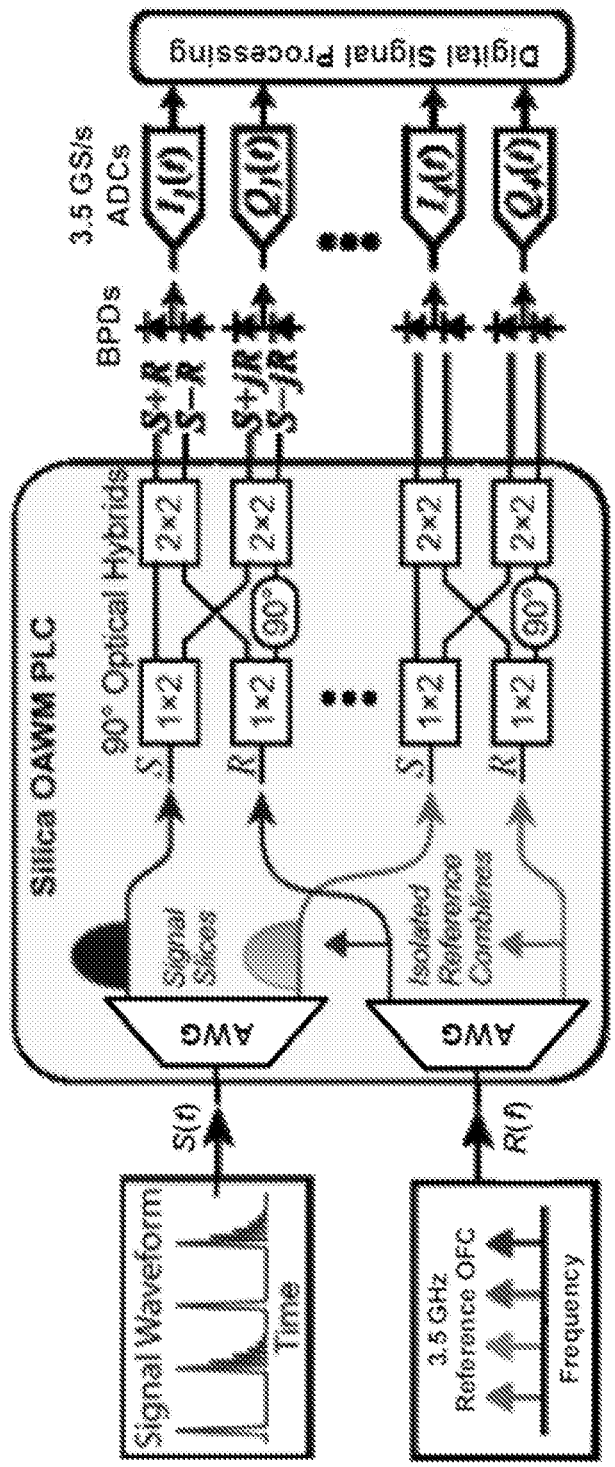
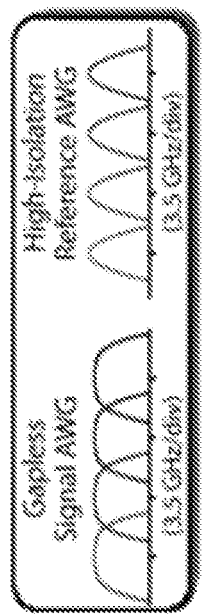
FIG. 2A
FIG. 2B

HIGH-SPEED OPTICAL ANALOG-TO-DIGITAL CONVERTER BASED ON COMPRESSIVE SENSING

CROSS-REFERENCE TO RELATED APPLICATIONS

This application claims priority under 35 U.S.C. § 119(e) to U.S. Provisional Application Ser. No. 63/148,328, entitled "Compressive High Speed Transceivers with Compressive Sensing," by inventor Sung-Joo Ben Yoo, filed on 11 Feb. 2021. This application also claims priority under 35 U.S.C. § 119(e) to U.S. Provisional Application Ser. No. 63/039,901, entitled "Photonic Electronic Real Time Signal Processing," by inventor Sung-Joo Ben Yoo, filed on 16 Jun. 2020. The above-listed provisional applications are hereby incorporated by reference herein.

BACKGROUND

Field

The disclosed embodiments generally relate to designs for high-speed optical transceivers. More specifically, the disclosed embodiments relate to the design of an optical analog-to-digital converter (ADC) that operates based on compressive sensing.

Related Art

Recent performance improvements in optical communication systems are beginning to necessitate extremely high-speed detection and digitization of the measured data. However, the total measurement bandwidth provided by such systems is presently limited by existing digitizers to just a few tens of gigahertz (low resolution), and direct scaling to larger optical bandwidths relies on the relatively slow progress of analog-to-digital converter (ADC) performance. This is illustrated by the graph in FIG. 1, which plots ADC bandwidth performance reported at the International Solid-State Circuits Conference (ISSCC) between 1997 and 2012, wherein the trend lines are determined primarily by the top performers for each year. Unfortunately, the future outlook for high-fidelity high-speed ADCs (e.g., those with an effective number of bits (ENOB)>8 and bandwidth>25 GHz) is particularly grim. The historic trend indicates that 100 Gsps (50 GHz bandwidth) ADCs with >8 ENOB will not be available for almost another ten years, and it is unlikely that we will see >1 THz bandwidth and >10 ENOB ADCs in the foreseeable future.

In contrast, recent progress in optical digital coherent receivers for optical waveform measurement using electronic ADCs in parallel has been very successful. (See M. G. Taylor, "Coherent Detection and Method Using DSP for Demodulation of Signal and Subsequent Equalization of Propagation Impairments," *IEEE Photonics Technology Letters*, vol. 16, pp. 674-676, 2004.) This is primarily because high-speed sampling of the received signals has enabled optical reference phase estimation without the use of phase-locked loops (PLLs). In these types of systems, it is possible for optical digital coherent receivers to measure the full optical field (amplitude and phase) of a signal waveform by digitizing the photodetected signals from a phase-diversity (multiport) homodyne receiver, and then reconstructing the in-phase (I) and quadrature-phase (Q) signals (i.e., full field) using digital signal processing (DSP). (See A. Davis, et al., "Phase Diversity Techniques for Coherent Optical Receivers," *Journal of Lightwave Technology*, vol. 5, pp. 561-572, 1987. Also see S. J. Savory, et al., "Electronic Compensation of Chromatic Dispersion Using a Digital Coherent Receiver," *Optics Express*, vol. 15, pp. 2120-2126, 2007.)

Hence, what is needed is a technique for exploiting the recent progress in optical digital coherent receivers without the performance limitations imposed by existing digitizers.

SUMMARY

The disclosed embodiments provide a system that implements an optical analog-to-digital converter (ADC). During operation, the system receives an optical input signal system and a reference optical frequency comb (OFC) signal. Next, the system uses a gapless spectral demultiplexer to spectrally slice the optical input signal to produce a set of spectral slices. At the same time, the system uses a high-contrast demultiplexer to strongly isolate each combline of the reference OFC signal to produce a set of reference comblines. The system then uses a demodulator, which in a parallel manner demodulates each spectral slice in the set of spectral slices centered on a single reference combline in the set of reference comblines to produce a set of baseband I/Q signals, wherein each spectral slice is demodulated based on a known code sequence. Next, the system uses a set of electronic ADCs to digitize the set of baseband I/Q signals to produce a set of digitized signals. Finally, the system uses a digital signal processor (DSP) to process the set of digitized signals to directly reconstruct a waveform for the optical input signal.

In some embodiments, the gapless spectral demultiplexer comprises a gapless arrayed waveguide grating (AWG).

In some embodiments, the high-contrast demultiplexer comprises a high-contrast narrow passband AWG.

In some embodiments, the demodulator performs demodulation operations based on homodyne four-quadrature coherent balanced detection.

In some embodiments, the set of reference comblines pass through a set of optical modulators prior to passing into the demodulator, wherein the set of optical modulators perform modulation operations on the set of reference comblines based on known code sequences to facilitate compressive sensing.

In some embodiments, the known code sequences comprise randomized code sequences.

In some embodiments, the set of optical modulators perform amplitude modulation operations.

In some embodiments, the set of optical modulators perform phase-modulation operations.

In some embodiments, the reference OFC signal passes through a single optical modulator prior to passing into the high-contrast demultiplexer, wherein the single optical modulator performs modulation operations based on known code sequences to facilitate compressive sensing.

In some embodiments, the reference OFC signal is produced by a local oscillator.

In some embodiments, the local oscillator comprises an optical frequency comb.

In some embodiments, the local oscillator comprises a coherent multiple optical frequency source.

In some embodiments, the DSP is configured to perform compressive sensing L1 reconstruction for detected signals associated with each spectral slice.

In some embodiments, the DSP is configured to use optical arbitrary waveform generation (OAWG) to synthesize a full waveform based on the compressive sensing L1 reconstruction of the detected signals.

BRIEF DESCRIPTION OF THE FIGURES

FIG. 2A illustrates an optical ADC based on optical arbitrary waveform measurements (OAWMs) in accordance with disclosed embodiments.

FIG. 2B compares signals produced by a gapless signal arrayed waveguide grating (AWG) with signals produced by a high-isolation reference AWG in accordance with disclosed embodiments.

DETAILED DESCRIPTION

Figure 1:
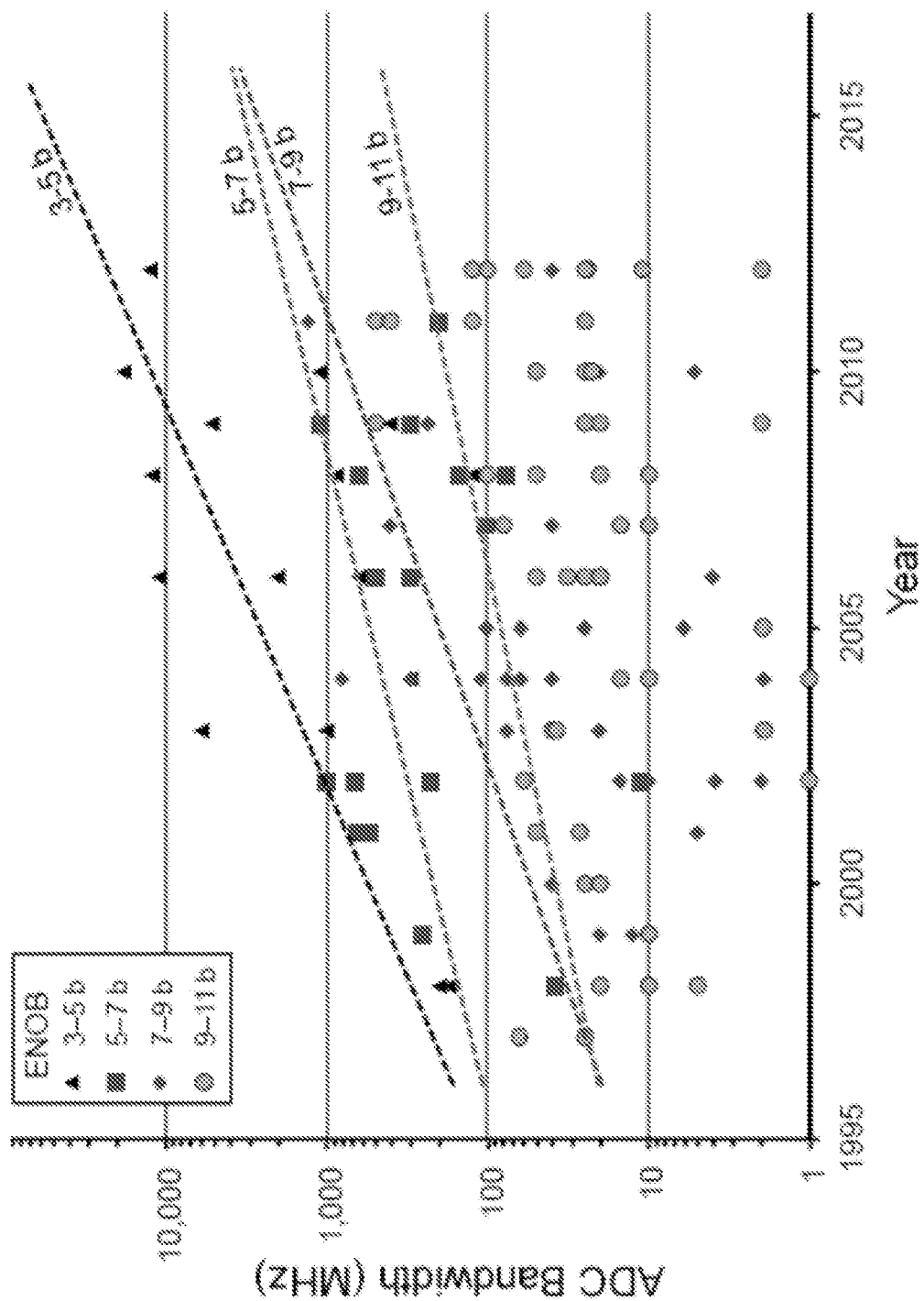
FIG. 1 presents a graph illustrating trend lines for ADC bandwidth performance from 1995 to 2015 in accordance with disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

DISCUSSION

Because our new waveform measurement technique is analogous to OAWG, we refer to it as "real-time optical arbitrary waveform measurement" (OAWM). Broadly speaking, OAWM uses spectral slicing of an optical signal with parallel optical homodyne detection using an optical frequency comb (OFC) as a reference. This spectral slicing is conceptually similar to bandwidth interleaving or frequency interleaving techniques used in some high-speed digitizers. Starting with the silica OAWM planar lightwave circuit (PLC) of FIG. 2A, a gapless arrayed-waveguide grating (AWG) (FIG. 2B) spectrally slices (demultiplexer) the large optical bandwidth, time-varying signal waveform, S(t). Simultaneously, a narrow-passband AWG strongly isolates each line of the reference OFC, R(f). In a parallel manner, each spectral slice, centered on a single combline, is demodulated to baseband I/Q signals using homodyne four-quadrature coherent balanced detection in the time-domain. The I/Q signals of each slice are digitized, and then digital signal processing (DSP) directly reconstructs the measured signal waveform. Of course, knowledge of the signal multiplexer's transmission function, the photodiodes' and digitizers' electronic responses, and the reference OFC amplitude and phase (obtainable by various multi-shot characterization techniques or even through self-calibration) are all desirable for accurate reconstruction.

An important consequence of the spectral-slice OAWM approach is that it enables continuous high-fidelity real-time waveform measurement with an optical bandwidth B while only requiring a detection bandwidth of B/(2/V), where N is the number of spectral slices or comblines and quadrature detection is assumed. The fidelity of the OAWM can be expressed as an effective number of bits (ENOB) (i.e., the quantization or resolution for setting amplitude, phase, or a quadrature value), which will be a result of composite signal-to-noise-and-distortion ratio (SINAD) of the photodetectors, the digitizer, and the OFC. Further, all practical OAWM implementations require maintaining the coherence between the spectral slices as well as between the lines of the OFC. A compact and monolithically integrated OAWM device is ultimately desired for stability and high-fidelity waveform measurement.

The ultimate performance of an OAWM system is limited by the performance of the optical frequency comb (OFC) and the electronic digitizers. For instance, for an OAWM system covering 50 GHz (100 Gsps) and achieving 8 ENOB, the reference OFC must achieve 50 dB or higher SINAD, estimated from SINAD (dB)=6.02×ENOB+1.76. This in turn requires that: (1) the OFC must cover 50 GHz bandwidth with less than 28 fs rms jitter, relative amplitude noise less than ~53 dBc, and higher than 100 mW total optical output power; and (2) digitization of each photodetected I/Q signal must achieve an 8 ENOB, in other words, a spur-free-dynamic-range (SFDR) higher than 50 dBc or SINAD of higher than 50 dB.

Optical Frequency Comb (OFC) Generation

Figure 3:
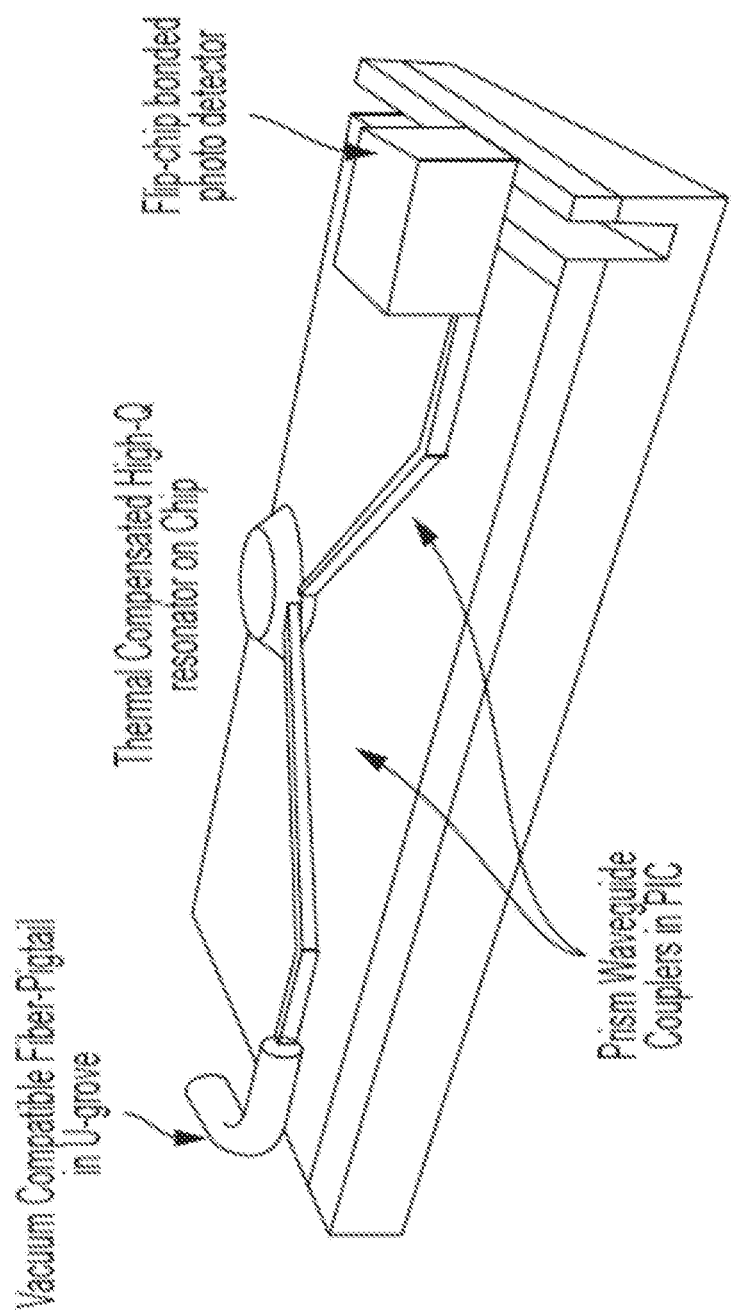
FIG. 3 illustrates a whispering gallery mode (WGM) high-Q resonator integrated on an input/output prism waveguide coupler photonic integrated circuit (PIC) in accordance with disclosed embodiments.
Figure 10:
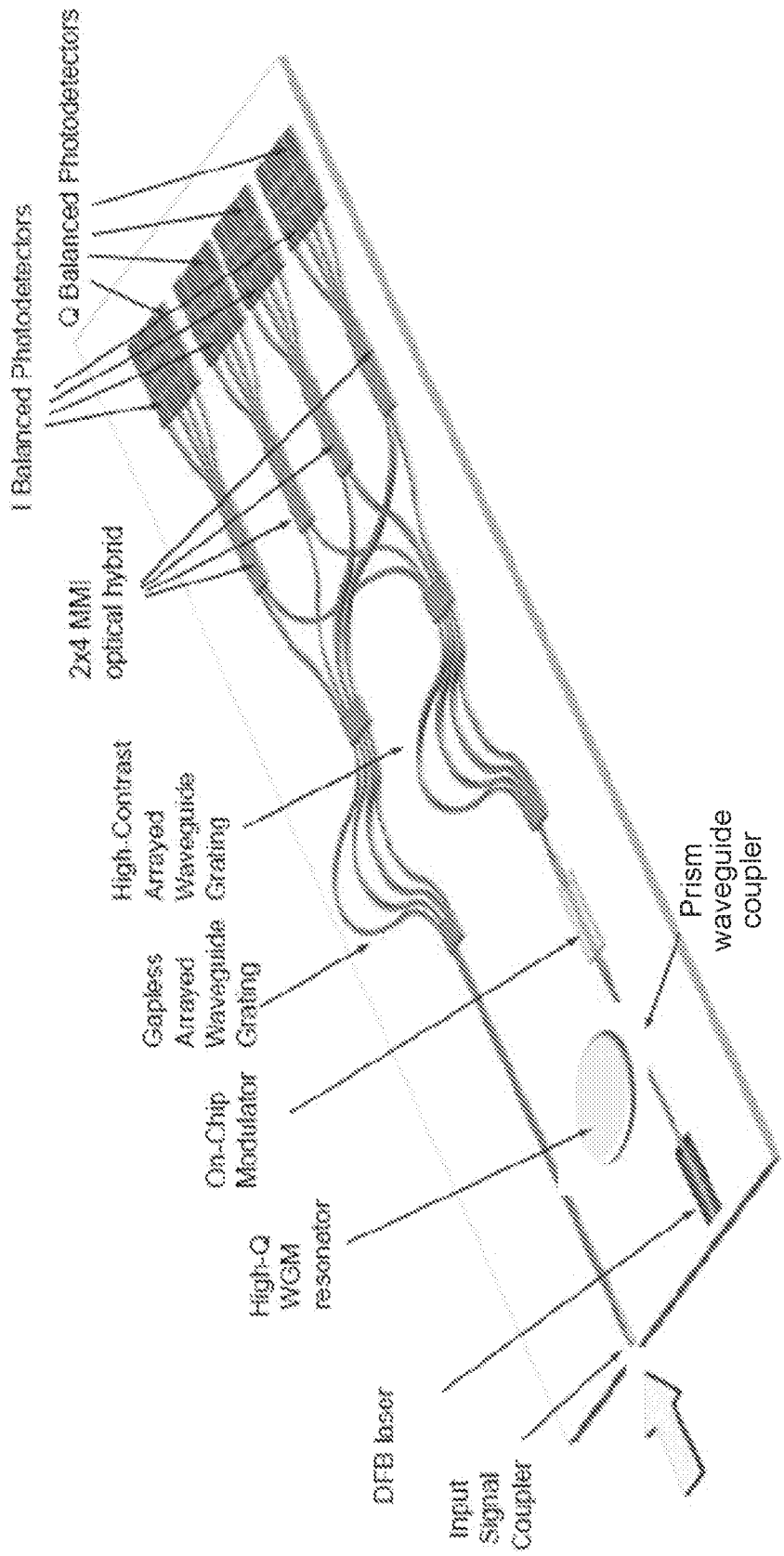
FIG. 10 illustrates a silicon-photonic implementation of the RF-photonic receivers illustrated in FIG. 7C in accordance with disclosed embodiments.
Figure 11:
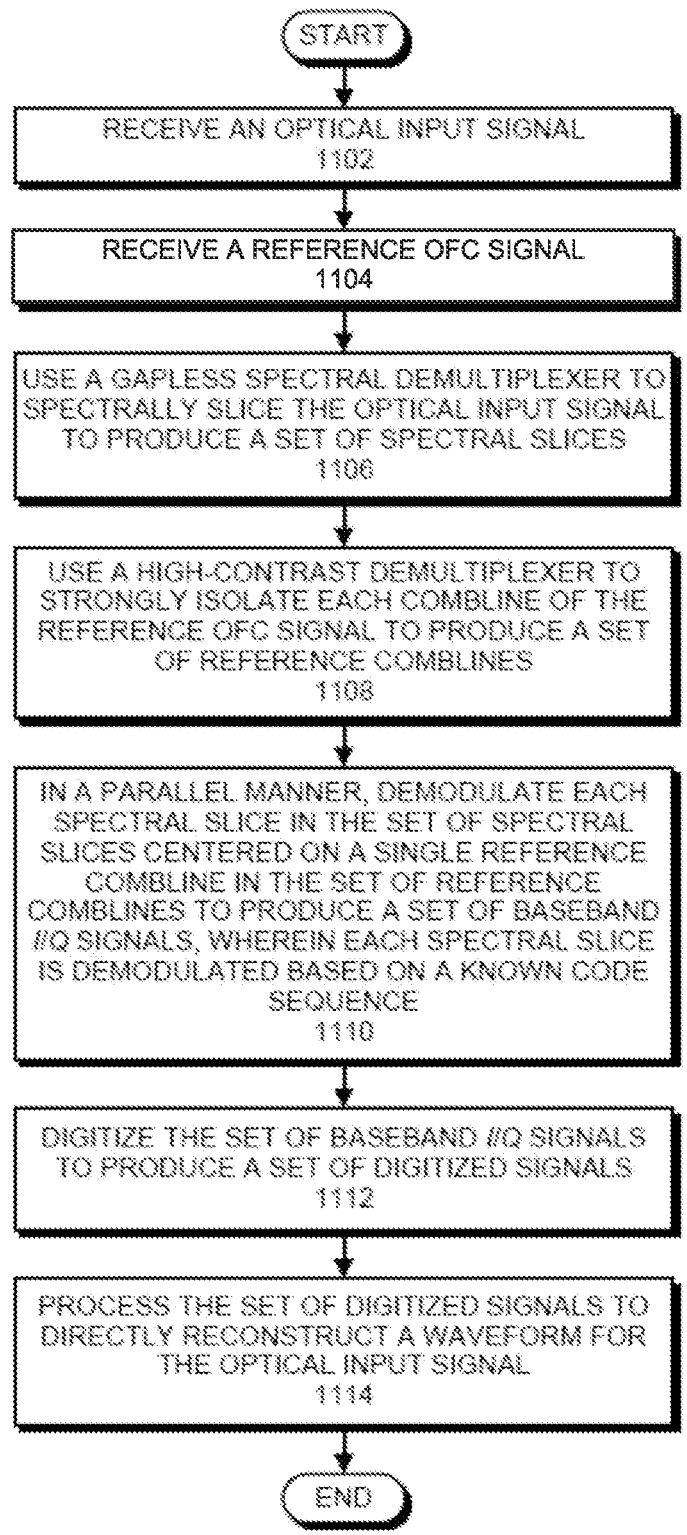
FIG. 11 presents a flow chart illustrating the process of performing an optical analog-to-digital conversion operation based on compressive sensing in accordance with disclosed embodiments.

Ultra-Low Noise, Narrow-Linewidth, and Optical Frequency Comb Generation on Chip As illustrated in FIG. 3, the prism waveguide coupler allows heterogeneous photonic integration of low refractive index micro resonators on the photonic-integrated-circuit (PIC) platform with phase matching and mode matching with less than 1 dB coupling loss. Typically, planar integration of crystalline WGM resonators is problematic when their refractive index is smaller than the refractive index of the substrate supporting the waveguide. To achieve the coupling and preserve the high Q, the waveguide should protrude from the substrate by a distance comparable with the optical wavelength. This is not a simple task since the waveguide must have a rather small cross section to support only a single mode. We have achieved this, and we propose to integrate this prism waveguide as part of the photonic integrated circuit as shown in FIGS. 10 and 11. Note that this integration method can use a commercial silicon photonic foundry process followed by custom heterogeneous integration steps.

Figure 4A:
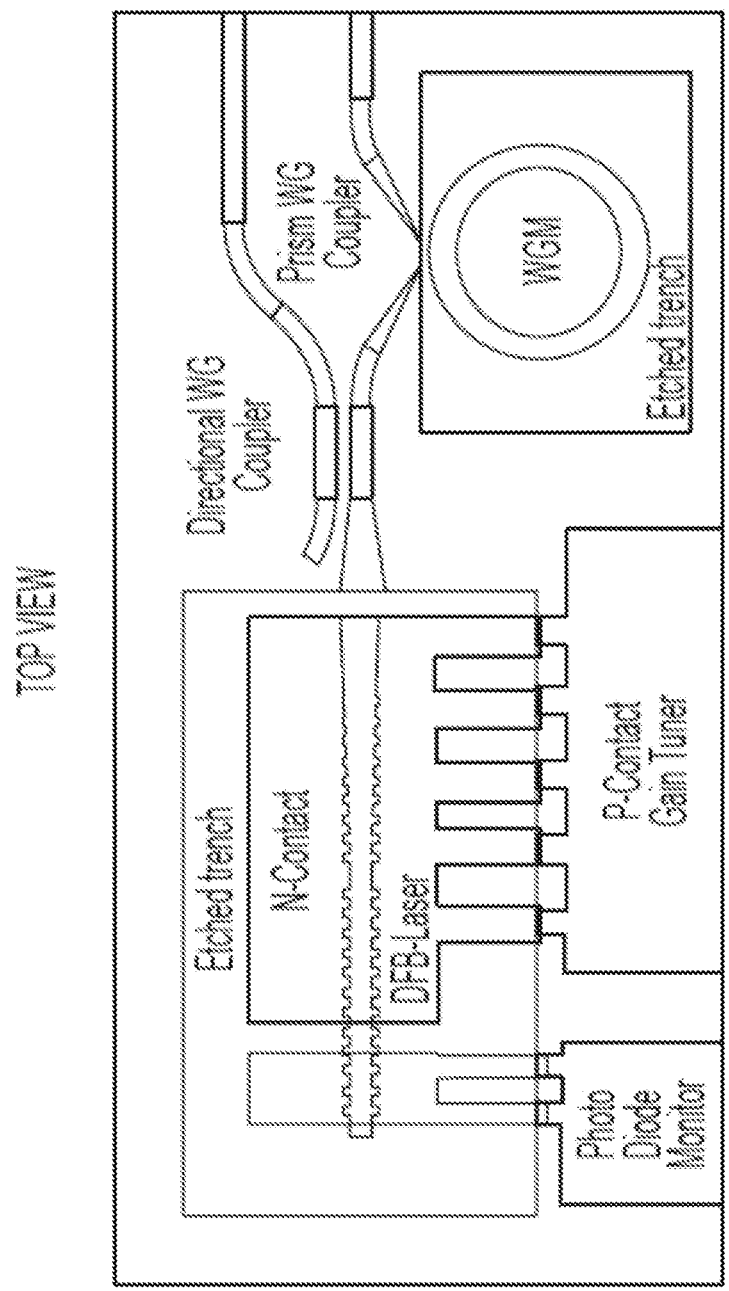
FIG. 4A presents a top view of a self-injection-locked distributed feedback (DFB) laser with an external low-loss waveguide, a directional coupler and a high-Q WGM resonator in accordance with disclosed embodiments.
Figure 4B:
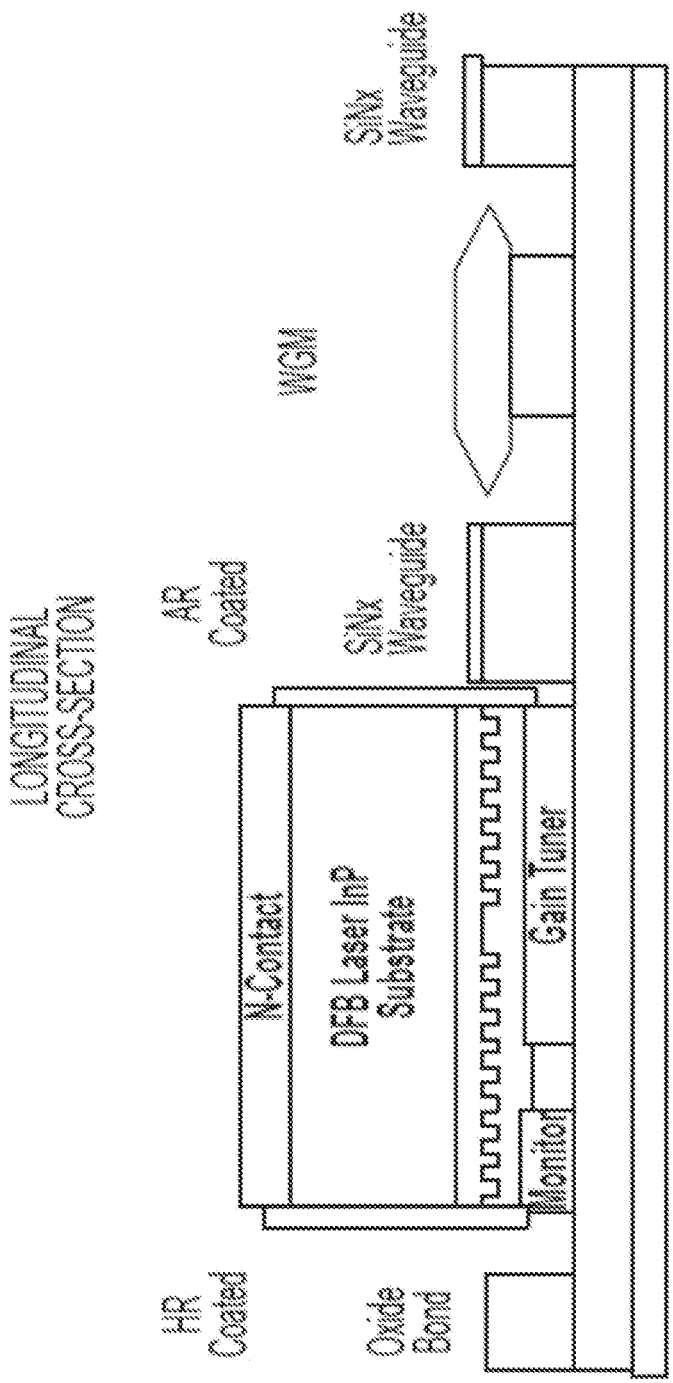
FIG. 4B presents a longitudinal cross-sectional view of the DFB laser illustrated in FIG. 4A in accordance with disclosed embodiments.

A commercial product produced by OEwaves, Inc., injection locks DFB laser chips using the narrow-band reflection from the high-Q resonator to achieve stable, low-noise, and narrow-linewidth (1~4 Hz) operation generating solitons. As mentioned above, we fabricated an on-chip prism waveguide coupler for high-Q WGMs and successfully demonstrated the self-injection-locked DFB lasers using the on-chip-coupled WGMs. We have also achieved an external fiber Bragg grating locked slab-coupled optical waveguide laser (SCOWL) with 15% power efficiency. We plan to construct a self-injection-locked DFB laser with a high-Q WGM on-chip coupled by the prism waveguide coupler. FIGS. 4A and 4B illustrate the proposed self-injection-locked DFB laser, which uses an external low-loss $Si_3N_4/SiO_2$ waveguide, a directional coupler, and a high-Q WGM. The DFB laser-block on the InP wafer will exploit high-quality strained AlInGaAs quantum wells (MQW) to provide high-efficiency gain even at high junction temperatures, and the selective etching of the MQW on InGaAsP/InP can realize active-passive integration to include a phase-tuning section as part of the cavity. The low-loss coupling between the mode-matched and anti-reflection coated angled facets in the $Si_3N_4/SiO_2$ waveguide provides a low-loss and high efficiency DFB with the aforementioned agile and independent control of phase, wavelength, and gain. Further, the $Si_3N_4/SiO_2$ waveguides include an on-chip sidewall DBR with a local heater with 1 GHz/mW tuning efficiency for the DBR wavelength, and tuning of the phase section of the InGaAsP/InP waveguide provides phase control and fine-tuning of the lasing wavelength, while the back reflection from the micro-resonator will injection-lock the laser.

Compressive Sensing

Conventional sensor systems suffer from an information bottleneck due to a tradeoff among competing performance capabilities as well as competing resources by following the Nyquist/Shannon sampling theory. An alternative theory of "compressive sampling" has emerged which shows that super-resolved signals and images can be reconstructed from far fewer data measurements than what is usually considered "necessary." This is accomplished by taking only a few "information-rich" measurements, using the fact that many natural signals are sparse or compressible in some domain (Fourier, wavelet, etc.).

It is important to note that lossless compression is possible non-adaptively for sparse signals. (See [Candes 2008] E. J. Candes and M. B. Wakin, "An introduction to compressive sampling," *IEEE Signal Processing Magazine*, vol. 25, pp. 21-30, 2008.) As mentioned in [Candes 2008], Candes' Theorem 1 concludes that:

(1) There is no information loss by measuring almost any set of m coefficients which may be far less than the signal dimension n. As discussed in detail in [Candes 2008], for incoherent data (i.e., if $\mu(\phi, \psi)$ is equal or close to one), ~S log n sample measurements suffice instead of n. Here, S is from S-sparse such objects with at most S nonzero entries.

(2) The signal f can be exactly recovered from our condensed data set by minimizing a convex functional which does not assume any knowledge about the number of nonzero coordinates of x, their locations, or their amplitudes which we assume are all completely unknown a priori. If the signal happens to be sufficiently sparse, exact recovery occurs by simply running the recovery algorithm.

Figure 5:
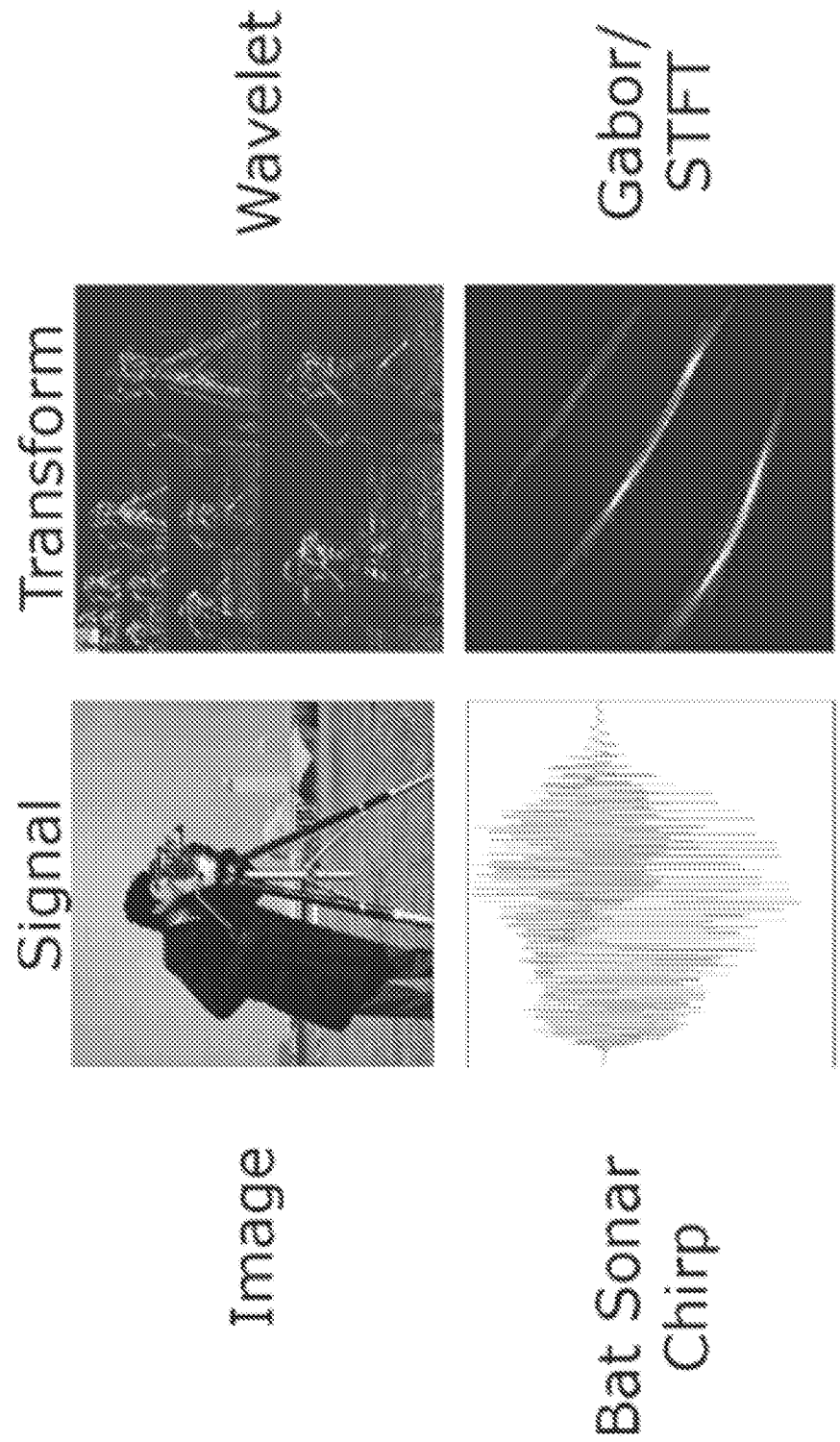
FIG. 5 illustrates exemplary signals and associated transforms that reveal sparsity in accordance with disclosed embodiments.

Nearly all known measurement data are sparse. RF receiver signals in particular are sparse data in the time-frequency domain. FIG. 5 shows examples of signals and transformations that reveal such sparsity.

Figure 7A:
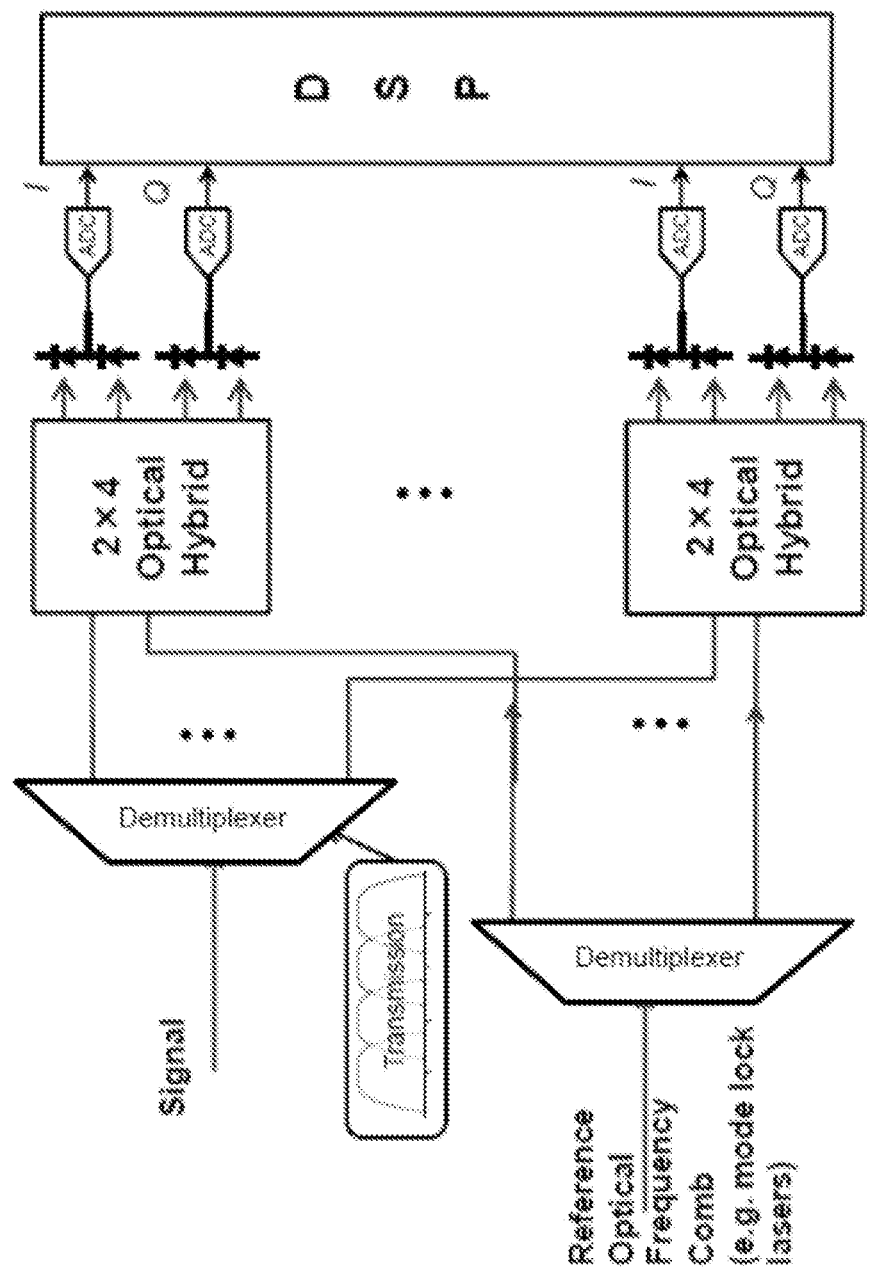
FIG. 7A illustrates a standard configuration for an OAWM-based ADC in accordance with disclosed embodiments.
Figure 7B:
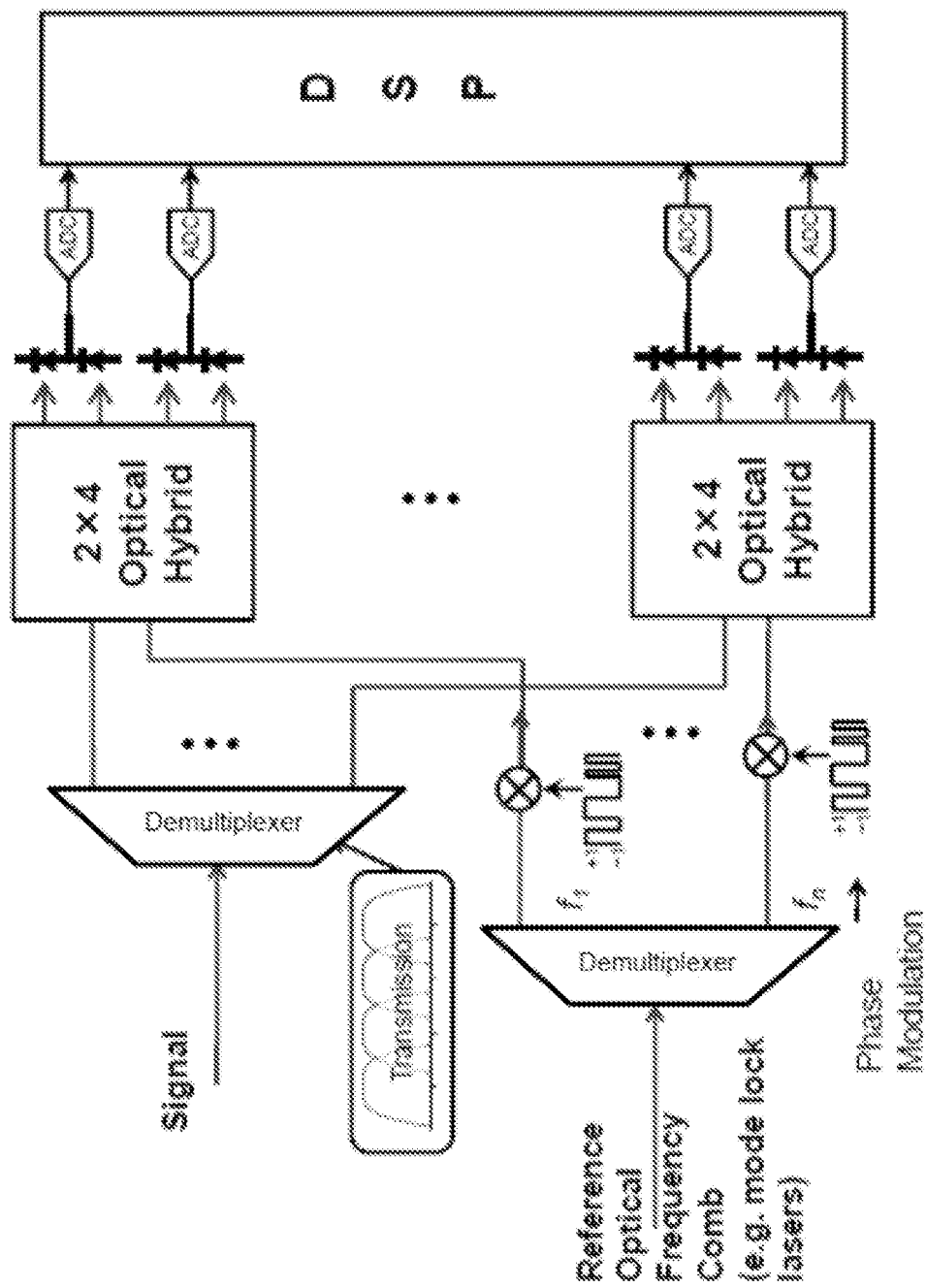
FIG. 7B illustrates a modified configuration for an OAWM-based ADC with phase-modulated reference signals to provide compressive sensing in accordance with disclosed embodiments.
Figure 7C:
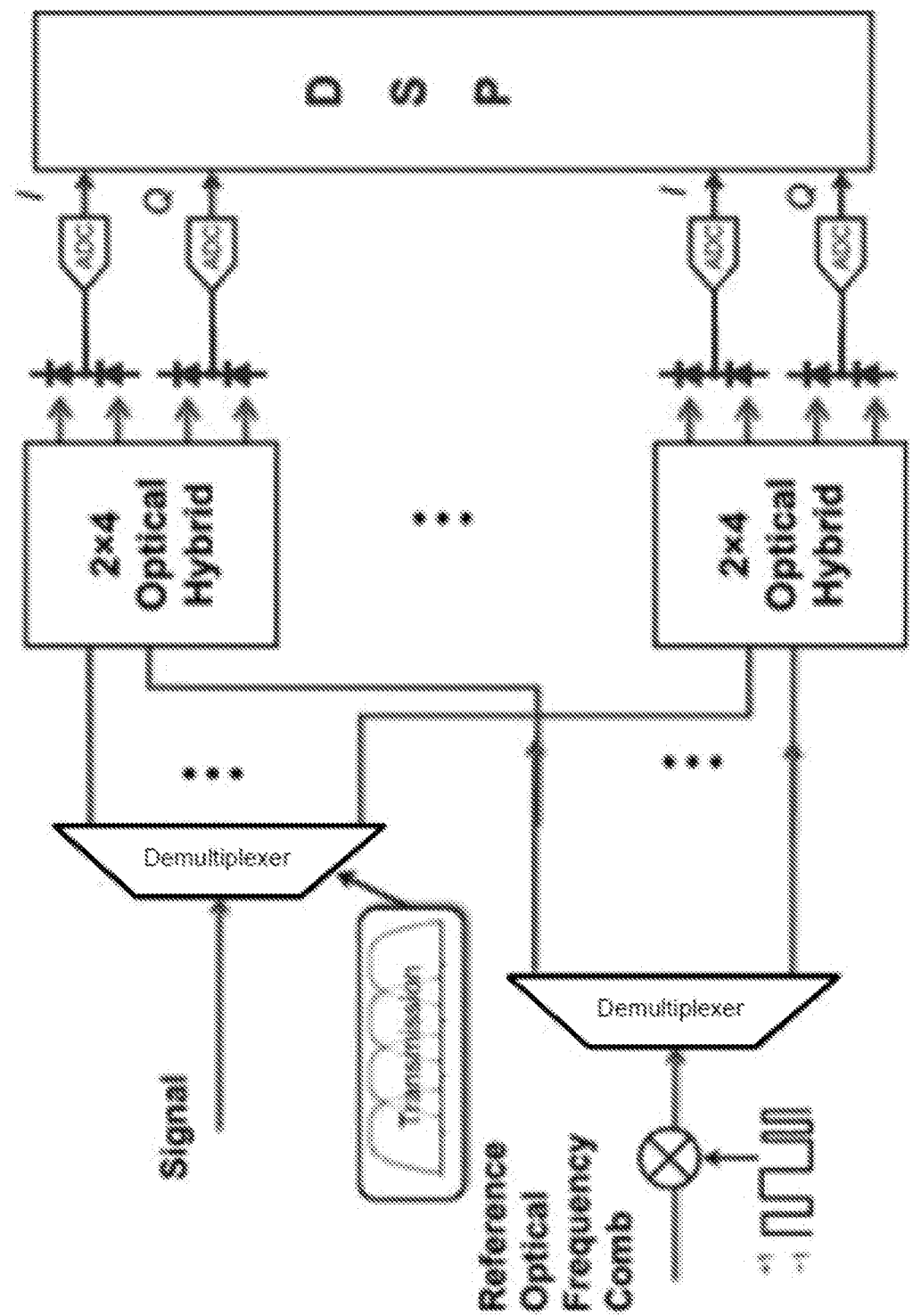
FIG. 7C illustrates another modified configuration for an OAWM-based ADC, wherein all the comblines are modulated together by one modulator using known code sequences, in accordance with disclosed embodiments.

We now refer to the block diagrams that appear in FIGS. 7A-7C. FIG. 7A illustrates the OAWM-based photonic ADC setup in a standard configuration as shown in FIG. 2A without compressive sensing. FIG. 7B illustrates a modified configuration with phase-modulated reference signals to provide compressive sensing (e.g., detection of information using low bandwidth electronic ADC helped by the modulation of the reference optical frequency comb). FIG. 7C is the same as FIG. 7B except all comblines are modulated together by one modulator using one set of codes. Note that the modulation pattern of the OFC or the switching pattern of the optical switch is known a priori and will be used for recovery of the data using limited resources (e.g., a set of I/Q balanced detectors and electronic ADCs instead of 15 sets).

The i-th coherent detection using the i-th optical combline is expected to produce the following electrical signal $I'_i(t)$ and $Q'_i(t)$:

$$I'_i(t) = \text{Re}[E_x^R(t) E_x^S(t) \exp j2\pi((f_i^S - f_i^R)t + \varphi_i^S - \varphi_i^R)]$$

$$E'_i(t) = \text{Im}[E_x^R(t) E_x^S(t) \exp j2\pi((f_i^S - f_i^R)t + \varphi_i^S - \varphi_i^R)]$$

The actual detected signals include contributions from all optical frequency comblines. For a known electrical bandwidth and optical bandwidth product $R_i$ of each i-th spectral band, the detected signals $I_i(t)$ and $Q_i(t)$ are given as:

$$I'_i(t) = \text{Re} \sum_{j=1}^{N} [E_x^R(t) E_x^S(t) \exp j2\pi((f_i^S - f_i^R)t + \varphi_i^S - \varphi_i^R)]$$

Figure 6:
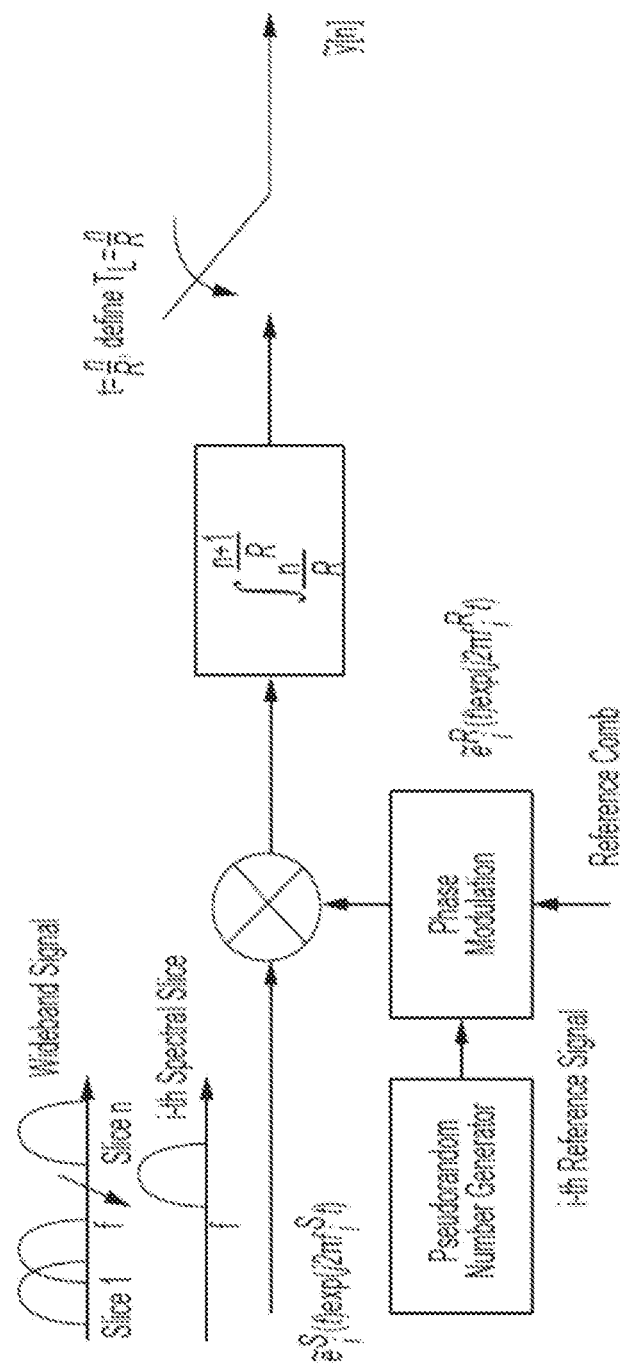
FIG. 6 illustrates a detailed design for the i-th spectral slice with a phase-modulated reference signal in accordance with disclosed embodiments.

$Q'_i(t) = \text{Im} \Sigma_{j=1}^{N} [E_x^R(t) E_x^S(t) \exp j2\pi((f_i^S - f_i^R)t + \varphi_i^S - \varphi_i^R)]$ When using a dynamically modulated optical frequency combline as proposed here, the time dependence of the phase and amplitude will determine $E_x^R(t)$, $f_i^R(t)\varphi_i^R(t)$. FIG. 6 presents a detailed design of the i-th spectral slice with a phase-modulated reference signal. We will use simple phase modulations (0, π) on each combline or on all comblines simultaneously using a set of codes as shown in FIG. 7C.

Compressive RF-Photonic Receiver Example

Figure 8:
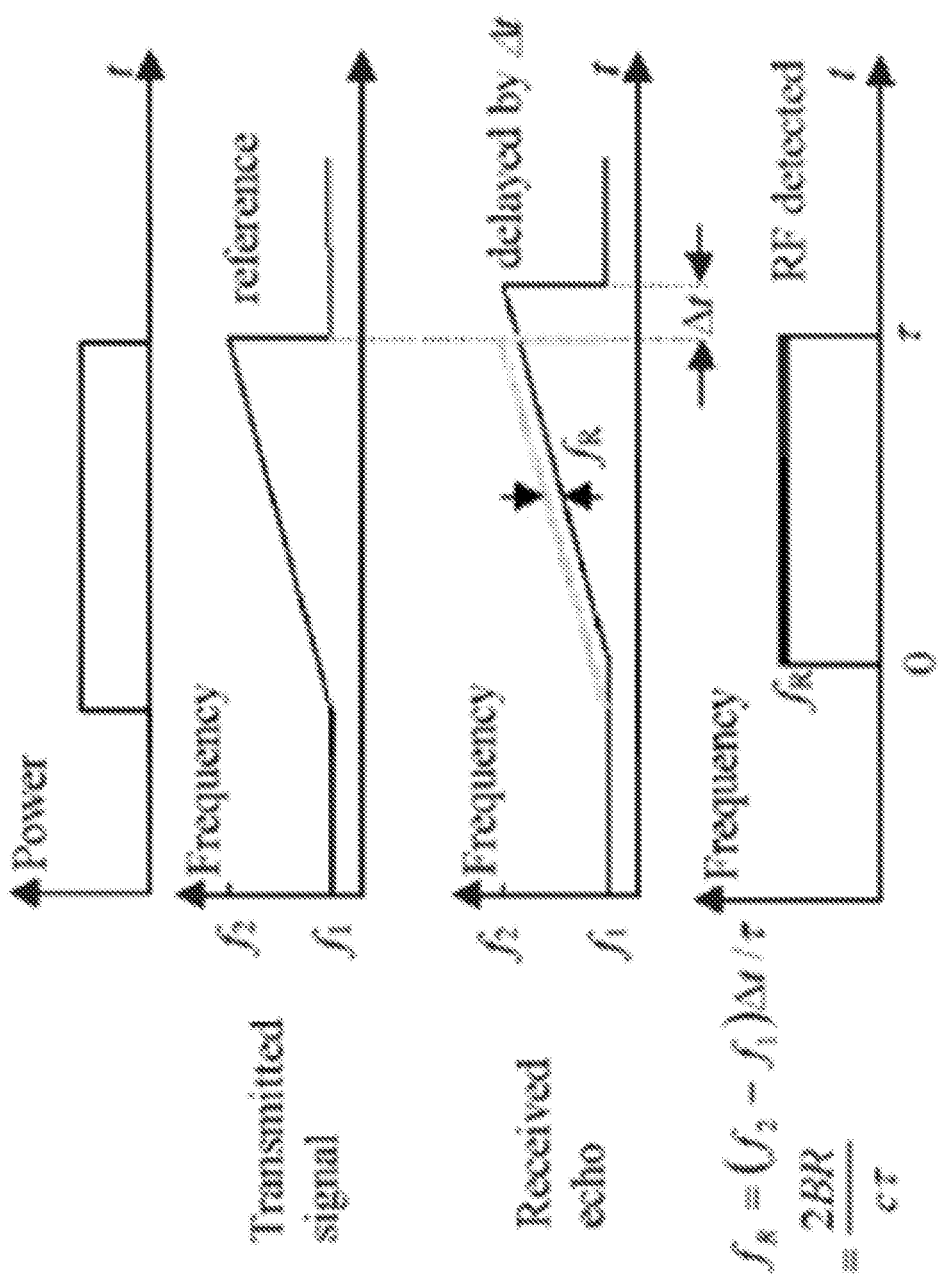
FIG. 8 presents graphs illustrating linear FM chirping in accordance with disclosed embodiments.

The linearly chirped signal on an RF-photonic receiver is one of the simplest examples of sparse data where measurements need not cover the entire dimensions in time-frequency space. FIG. 8 shows linear FM chirping used in chirped RF-photonic receiver systems. (See G. Ding, C. Dehollain, M. Declercq, and K. Azadet, "Frequency-interleaving technique for high-speed A/D conversion," in *Proceedings of the 2003 International Symposium on Circuits and Systems (ISCAS '03)*, 2003, pp. 857-860.)

Figure 9:
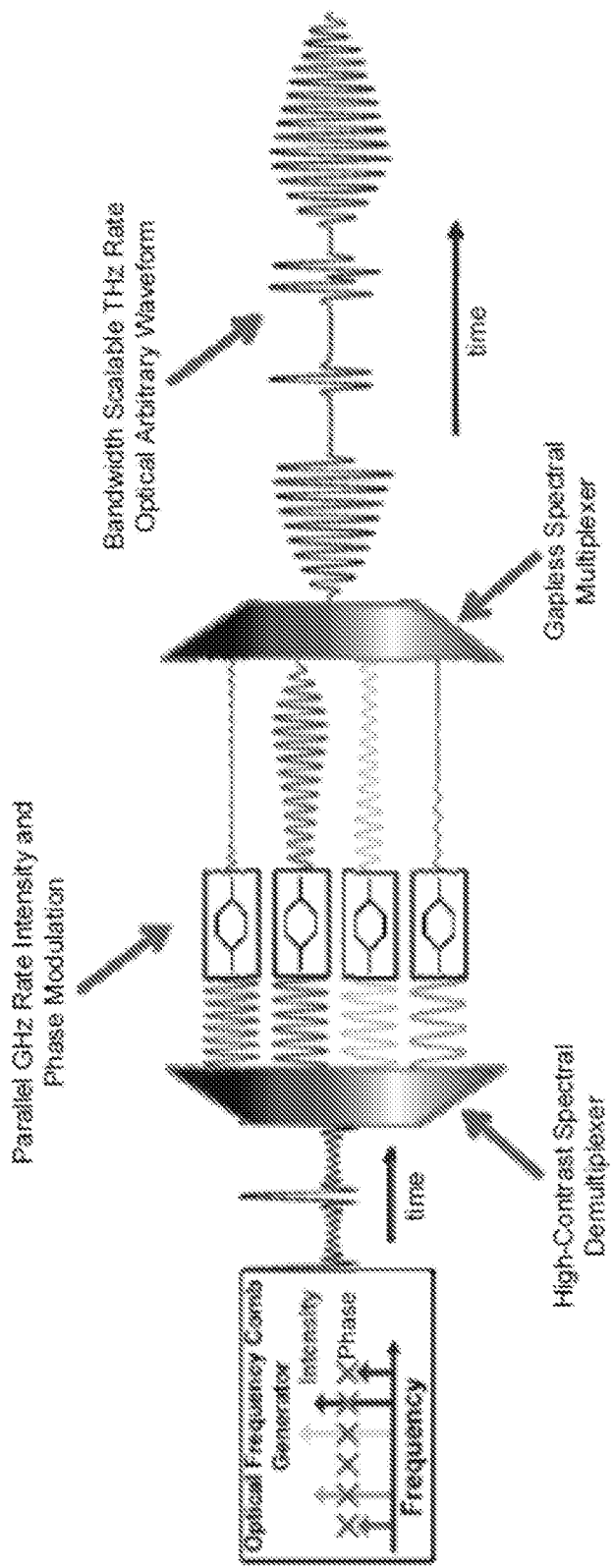
FIG. 9 illustrates a dynamic OAWG that creates coded optical frequency comblines as an RF-photonic transmitter instead of a simple FM chirped optical frequency in accordance with disclosed embodiments.

More recently, the importance of coded RF-photonic receivers for jamming-tolerant imaging has emerged. We plan to pursue compressive photonic ADCs using the OAWM discussed with reference to FIGS. 7B-7C with code-modulated optical frequency combs as the RF-photonic receiver together with the same code-modulated optical frequency combs as the RF-photonic transmitter. Compressive measurement in the coded RF-photonic receivers allows minimal (10×) reduction) in optical and electronic resources while supporting low-noise and lossless compression for sparse signals. Hence, the RF-photonic transmitter can use the dynamic optical arbitrary waveform generation (OAWG) as illustrated in FIG. 9 instead of the simple FM chirped optical frequency shown in FIG. 8. The receiver can use the same OAWG signal from the RF-photonic transmitter replacing the optical frequency comb in FIGS. 7B and 7C with additional modulation imposed for compressive sensing.

Silicon Photonic Realization of Compressive RF-Photonic Receivers

FIG. 10 illustrates compressive RF-photonic receivers realized on a silicon photonic implementation following the architecture of FIG. 7C. Note the on-chip high-Q WGM resonator is integrated on-chip using the prism waveguide coupler and the DFB laser to form an ultra-low noise, self-injection-locked, optical-frequency comb (OFC) generator as illustrated in FIG. 4. The generated OFC will be modulated by an on-chip silicon photonic modulator, which can be a simple phase modulator or an I-Q modulator, or even an OAWG as is illustrated in FIG. 9. The modulated OFC will be demultiplexed by the high-contrast arrayed waveguide grating (AWG) in each combline, which will enter as a local oscillator to the optical coherent receiver comprising the 2×4 MMI optical hybrid and I and Q balanced photodetectors for each combline.

The gapless AWG will demultiplex the input signal into spectral slices, and will enter the signal port of the aforementioned optical coherent receiver for each combline. Through the analog-to-information compressive sensing mechanism at each coherent receiver using the code-modulated local oscillator, and through the proven OAWM signal synthesis method, full wave content of the incoming optical signal will be realized, thus achieving the desired ultra-wide band RF-photonic analog to digital conversion.

Performing an Analog-to-Digital Conversion Operation

FIG. 11 presents a flow chart illustrating the process of performing an optical analog-to-digital conversion operation in accordance with disclosed embodiments. During operation, the system receives an optical input signal (step 1102). At the same time, the system also receives a reference optical frequency comb (OFC) signal (step 1104). Next, the system uses a gapless spectral demultiplexer to spectrally slice the optical input signal to produce a set of spectral slices (step 1106). The system also uses a high-contrast demultiplexer to strongly isolate each combline of the reference OFC signal to produce a set of reference comblines (step 1108). Next, in a parallel manner, the system demodulates each spectral slice in the set of spectral slices centered on a single reference combline in the set of reference comblines to produce a set of baseband I/Q signals, wherein each spectral slice is demodulated based on a known code sequence (step 1110). The system then digitizes the set of baseband I/Q signals to produce a set of digitized signals (step 1112). Finally, the system processes the set of digitized signals to directly reconstruct a waveform for the optical input signal (step 1114).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An optical analog-to-digital converter (ADC), comprising:
 a signal input that receives an optical input signal;
 a reference input that receives a reference optical frequency comb (OFC) signal;
 a gapless spectral demultiplexer, which spectrally slices the optical input signal to produce a set of spectral slices;
 a high-contrast demultiplexer, which strongly isolates each combline of the reference OFC signal to produce a set of reference comblines;
 a demodulator, which in a parallel manner demodulates each spectral slice in the set of spectral slices centered on a single reference combline in the set of reference comblines to produce a set of baseband I/Q signals, wherein:
  the set of reference comblines pass through a set of optical modulators prior to passing into the demodulator,
  the set of optical modulators perform modulation operations on the set of reference comblines based on first known code sequences to facilitate compressive sensing, and
  each spectral slice is demodulated based on a second known code sequence;
 a set of electronic ADCs, which digitize the set of baseband I/Q signals to produce a set of digitized signals; and
 a digital signal processor (DSP), which processes the set of digitized signals to directly reconstruct a waveform for the optical input signal.

2. The optical ADC of claim 1, wherein the gapless spectral demultiplexer comprises a gapless arrayed waveguide grating (AWG).

3. The optical ADC of claim 1, wherein the high-contrast demultiplexer comprises a high-contrast narrow passband AWG.

4. The optical ADC of claim 1, wherein the demodulator performs demodulation operations based on homodyne four-quadrature coherent balanced detection.

5. The optical ADC of claim 1, wherein the known code sequences comprise randomized code sequences.

6. The optical ADC of claim 1, wherein the set of optical modulators perform amplitude modulation operations.

7. The optical ADC of claim 1, wherein the set of optical modulators perform phase-modulation operations.

8. The optical ADC of claim 1, wherein the reference OFC signal passes through a single optical modulator prior to passing into the high-contrast demultiplexer, wherein the single optical modulator performs modulation operations based on known code sequences to facilitate compressive sensing.

9. The optical ADC of claim 1, wherein the reference OFC signal is produced by a local oscillator.

10. The optical ADC of claim 9, wherein the local oscillator comprises an optical frequency comb.

11. The optical ADC of claim 9, wherein the local oscillator comprises a coherent multiple optical frequency source.

12. The optical ADC of claim 1, wherein the DSP is configured to perform compressive sensing L1 reconstruction for detected signals associated with each spectral slice.

13. The optical ADC of claim 12, wherein the DSP is configured to use optical arbitrary waveform generation (OAWG) to synthesize a full waveform based on the compressive sensing L1 reconstruction for the detected signals.

14. An optical communication system, comprising:
an optical transmitter that transmits an optical signal; and
an optical receiver that receives the optical signal, wherein the optical receiver includes an optical analog-to-digital converter (ADC);
wherein the optical ADC comprises:
a signal input that receives an optical input signal;
a reference input that receives a reference optical frequency comb (OFC) signal;
a gapless spectral demultiplexer, which spectrally slices the optical input signal to produce a set of spectral slices;
a high-contrast demultiplexer, which strongly isolates each combline of the reference OFC signal to produce a set of reference comblines;
a demodulator, which in a parallel manner demodulates each spectral slice in the set of spectral slices centered on a single reference combline in the set of reference comblines to produce a set of baseband I/Q signals, wherein:
the set of reference comblines pass through a set of optical modulators prior to passing into the demodulator,
the set of optical modulators perform modulation operations on the set of reference comblines based on first known code sequences to facilitate compressive sensing, and
each spectral slice is demodulated based on a second known code sequence;
a set of electronic ADCs, which digitize the set of baseband I/Q signals to produce a set of digitized signals; and
a digital signal processor (DSP), which processes the set of digitized signals to directly reconstruct a waveform for the optical input signal.

15. The optical communication system of claim 14, wherein the gapless spectral demultiplexer comprises a gapless arrayed waveguide grating (AWG).

16. The optical communication system of claim 14, wherein the high-contrast demultiplexer comprises a high-contrast narrow passband AWG.

17. The optical communication system of claim 14, wherein the demodulator performs demodulation operations based on homodyne four-quadrature coherent balanced detection.

18. The optical communication system of claim 14, wherein the known code sequences comprise randomized code sequences.

19. The optical communication system of claim 14, wherein the set of optical modulators perform amplitude modulation operations.

20. The optical communication system of claim 14, wherein the set of optical modulators perform phase-modulation operations.

21. The optical communication system of claim 14, wherein the reference OFC signal passes through a single optical modulator prior to passing into the high-contrast demultiplexer, wherein the single optical modulator performs modulation operations based on known code sequences to facilitate compressive sensing.

22. The optical communication system of claim 14, wherein the reference OFC signal is produced by a local oscillator.

23. The optical communication system of claim 22, wherein the local oscillator comprises an optical frequency comb.

24. The optical communication system of claim 22, wherein the local oscillator comprises a coherent multiple optical frequency source.

25. The optical communication system of claim 14, wherein the DSP is configured to perform compressive sensing L1 reconstruction for detected signals associated with each spectral slice.

26. The optical communication system of claim 25, wherein the DSP is configured to use optical arbitrary waveform generation (OAWG) to synthesize a full waveform based on the compressive sensing L1 reconstruction for the detected signals.

27. A method for performing an optical analog-to-digital conversion operation, comprising:
receiving an optical input signal;
receiving a reference optical frequency comb (OFC) signal;
using a gapless spectral demultiplexer to spectrally slice the optical input signal to produce a set of spectral slices;
using a high-contrast demultiplexer to strongly isolate each combline of the reference OFC signal to produce a set of reference comblines;
performing modulation operations on the set of reference comblines based on first known code sequences to facilitate compressive sensing;
after performing said modulation operations, and in a parallel manner, demodulating each spectral slice in the set of spectral slices centered on a single reference combline in the set of reference comblines to produce a set of baseband I/Q signals, wherein each spectral slice is demodulated based on a second known code sequence;

digitizing the set of baseband I/Q signals to produce a set of digitized signals; and processing the set of digitized signals to directly reconstruct a waveform for the optical input signal.

\* \* \* \* \*